(12) United States Patent
Embree

(10) Patent No.: US 6,584,574 B1
(45) Date of Patent: Jun. 24, 2003

(54) FLEXIBLE PHASE-LOCKED LOOP SYSTEM TO INDICATE SYNCHRONIZATION USING DIFFERENCE BETWEEN INTERNAL AND EXTERNAL CLOCK SIGNALS

(75) Inventor: Paul Embree, Irvine, CA (US)

(73) Assignees: Sony Corporation, Tokyo (JP); Sony Electronics Inc., Park Ridge, NJ (US)

( * ) Notice: Subject to any disclaimer, the term of this patent is extended or adjusted under 35 U.S.C. 154(b) by 0 days.

(21) Appl. No.: 09/401,079

(22) Filed: Sep. 22, 1999

Related U.S. Application Data

(63) Continuation-in-part of application No. 08/992,641, filed on Dec. 17, 1997, now Pat. No. 6,104,222.

(51) Int. Cl.[7] .............................. G06F 1/12; H03L 7/06
(52) U.S. Cl. ...................................... 713/400; 327/156
(58) Field of Search ........................ 713/400; 340/825; 327/156

(56) References Cited

U.S. PATENT DOCUMENTS

| | | | | |
|---|---|---|---|---|
| 5,517,155 A | * | 5/1996 | Yamauchi et al. ............. 331/1 |
| 5,818,544 A | * | 10/1998 | Han ............................ 348/725 |
| 5,926,044 A | * | 7/1999 | Niimura ....................... 327/99 |
| 6,104,222 A | * | 8/2000 | Embree ....................... 327/156 |

* cited by examiner

Primary Examiner—Thomas Lee
Assistant Examiner—Eric Chang
(74) Attorney, Agent, or Firm—Blakely, Sokoloff, Taylor & Zafman LLP

(57) ABSTRACT

A stable and flexible synchronization system and method are disclosed. The method includes selecting to receive an external clock signal, detecting a difference between an internal clock signal and the selected external clock signal and generating a control signal representing the difference; determining if the control signal has a first value that is within a predetermined range; calculating a second value representing an absolute value of a difference between a current value of the control signal and a previous value of the control signal; determining if the value is less than a third value; resetting the output signal upon receipt of an edge of said selected external clock signal; determining if a timing difference between the output signal and the selected clock signal is substantially zero; and issuing a signal indicative of synchronization.

27 Claims, 14 Drawing Sheets

FIG. 3

| PERCENTAGE DERIVED | | | | | | | |
|---|---|---|---|---|---|---|---|
| Speed | 1 | 2 | 3 | 4 | 5 | 6 | |
| | Down Speed | 44.1KHz | Up Speed | Down Speed | 48.0KHz | Up Speed | |
| Reference | 44100.00 | 44100.00 | 44100.00 | 48000.00 | 48000.00 | 48000.00 | |
| Sample Freq ($f_1$) (Actual) | 44055.94 | 44100.00 | 44144.10 | 47952.05 | 48000.00 | 48048.00 | |
| XTAL Frequency ($f_V$) | 11278322 | 11289600 | 11300890 | 12275724 | 12288000 | 12300288 | |
| VIDEO DERIVED | | | | | | | |
| | 1 | 2 | 3 | 4 | 5 | 6 | |
| Target Freq. | 44100 | | 44100 | 48000 | | 48000 | |
| Div. 30 | 1470 | | 1470 | 1600 | | 1600 | |
| Frame Rate ($f_1$) | 29.9700 | | 30.0300 | 29.9700 | | 30.0300 | |
| x Frame | 44055.94406 | | 44144.10000 | 47952.04795 | | 48048.00000 | |
| XTAL Freq. ($f_V$) | 11278321.68 | | 11300889.6 | 12275724.28 | | 12300288 | |
| DIFFERENCES | | | | | | | |
| Difference (Hz) | 0.00000 | | 0.00000 | 0.00000 | | 0.00000 | |
| Difference (ppm) | 0.00 | | 0.00 | 0.00 | | 0.00 | |
| REFERENCE DATA (VIDEO TIMING) | | | | | | | |
| Color Burst | 3579545.455 | | | | | | |
| H Rate | 15734.26573 | | | | | | |
| Frame Rate ($f_1$) | 29.97002997 | 30.03000 | | | | | |
| % Speed (Calculated) | 0.999000999 | 1.00100000 | | | | | |
| Frame Rate ($f_1$) | 59.94005994 | 60.06000 | | | | | |

FIG. 4A

| | | | |
|---|---|---|---|
| Sample Rate (f₁) | 48000 | | |
| VCO Freq. (f_v) | 12288000 | | |
| | | | |
| | NTSC Color | NTSC BW | PAL |
| H Rate | 15734.26573 | 15750 | 15625 |
| P Divider | 15 | 10 | 10 |
| P Output Freq | 1048.951049 | 1575 | 1562.5 |
| | | | |
| D Divider | 32 | 32 | 32 |
| D Output Freq | 384,000.00 | 384,000.00 | 384,000.00 |
| N Divider | 50 | 42 | 50 |
| VCO Freq. | 19,200,000.00 | 16,128,000.00 | 19,200,000.00 |
| M Divider | 18304 | 10240 | 12288 |
| M Output Freq. | 1048.951049 | 1575 | 1562.5 |
| | | | |
| PFD Error | 0 | 0 | 0 |

FIG. 4B

| | | | |
|---|---|---|---|
| Sample Rate (f₁) | 44100 | | |
| VCO Freq. (f_v) | 11289600 | | |
| | | | |
| | NTSC Color | NTSC BW | PAL |
| H Rate | 15734.26573 | 15750 | 15625 |
| P Divider | 10 | 10 | 10 |
| P Output Freq | 1573.426573 | 1575 | 1562.5 |
| | | | |
| D Divider | 64 | 32 | 64 |
| D Output Freq | 176,400.00 | 352,800.00 | 176,400.00 |
| N Divider | 125 | 42 | 125 |
| VCO Freq. | 22,050,000.00 | 14,817,600.00 | 22,050,000.00 |
| M Divider | 14014 | 9408 | 14112 |
| M Output Freq. | 1573.426573 | 1575 | 1562.5 |
| | | | |
| PFD Error | 0 | 0 | 0 |

|  | On Speed | Up Speed | Down Speed | On Speed | Up Speed | Down Speed |
|---|---|---|---|---|---|---|
| Sample Rate (f₁) | 48000 | 48048.00 | 47952.05 | 44100 | 44144.10 | 44055.94 |
| VCO Freq. (f_v) | 12288000 | 12300288 | 12275724 | 11289600 | 11300890 | 11278322 |
|  | NTSC Color | NTSC Color | NTSC Color | NTSC Color | NTSC Color | NTSC Color |
| H Rate | 15734.26573 | 15734.26573 | 15734.26573 | 15734.26573 | 15734.26573 | 15734.26573 |
| P Divider | 15 | 15 | 10 | 10 | 10 | 10 |
| P Output Freq | 1048.951049 | 1048.951049 | 1573.426573 | 1573.426573 | 1573.426573 | 1573.426573 |
|  |  |  |  |  |  |  |
| D Divider | 32 | 32 | 32 | 64 | 32 | 32 |
| D Output Freq. | 384,000.00 | 384,384.00 | 383,616.38 | 176,400.00 | 353,152.80 | 352,447.55 |
| N Divider | 50 | 49 | 42 | 125 | 49 | 42 |
| VCO Freq. | 19,200,000.00 | 18,834,816.00 | 16,111,888.11 | 22,050,000.00 | 17,304,487.20 | 14,802,797.20 |
| M Divider | 18304 | 17956 | 10240 | 14014 | 10998 | 9408 |
| M Output Freq. | 1048.951049 | 1048.942749 | 1573.426573 | 1573.426573 | 1573.421277 | 1573.426573 |
|  |  |  |  |  |  |  |
| PFD Error | 0 | 0.008300009 | -2.27374E-13 | 0 | 0.005296831 | -2.27374E-13 |
| PPM Error |  | 7.912675429 |  |  | 3.36643026 |  |
|  |  |  |  |  |  |  |
|  |  | 17955.85792 |  |  | 10997.96298 |  |

FIG. 5

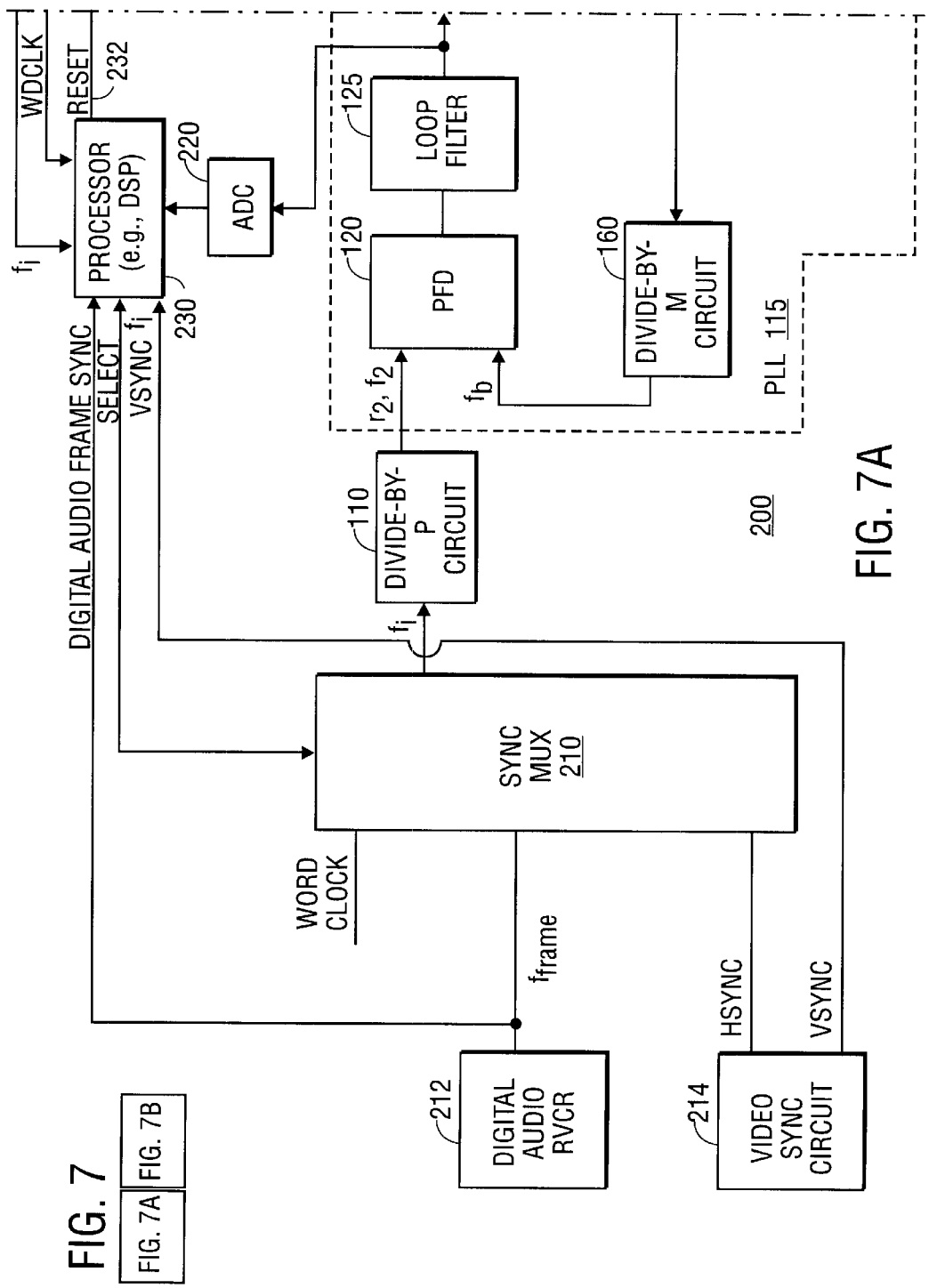

```c
/* Copyright SONY Corp. 1997 */ define UPPER_LOCK_LIMIT 0xE8
define LOWER_LOCK_LIMIT 0x18

/* lock status is updated every lockInterval audio samples (about every second) */
#define LOCK_INTERVAL 4605L         /* samples between lock status reports */
long-int lockInterval = LOCK_INTERVAL;

void UpdateLockStatus(int ADCData)
{
    static long int Delta;

Delta = SampleCount-LastSentTimeStamp;
    if (Delta > LockInterval) {
        int i;
        LastSentTimeStamp = SampleCount;

/* lock lost if large difference or out of range */
        if(abs(ADCData - LastPllADCData) <=7 &&
            ADCData < UPPER_LOCK_LIMIT &&
            ADCData > LOWER_LOCK_LIMIT) {

/* on lock transition from FALSE to TRUE, reset phase of WDclk */
            if (LockStatus == 0) {         /* first lock edge if false */
                GetAESTOD();                /* get TOD in from ext AES input */
                AES_SEL = 0x500;            /* set phase reset bit */
                LockStatus = 1;             /* set to 1 to indicate bit set */
            }
            else {
                if(LockStatus == 1) {
                    TODInI3 = 0;
                    while(!TODInI3);        /* wait for a full frame to get in */
```

FIG. 9

```c
/* use lower sample count word for small delay to align CBLs */
    i = SampleCountLSW;
    i += 42;
    while((i - SampleCountLSW) > 0);
    AES_SEL = 0x100;            /* release phase reset but */
    LockStatus = 2;             /* set to 2 so this single shots */
}
if(LockStatus == 2) {           /* check AES I/O CBLs */
    FIMuxSetting = FI_CBL_IN;   /* change mode to get input CBL edge */
    TODInI3 = 0;
    while(!TODInI3);            /* wait for a full frame to get in */
    i = SampleCountLSW;
    FIMuxSetting = FI_CBL_OUT;  /* change to output CBL edge */
    TODInI3 = 0;
    while(!TODInI3);            /* wait for a full frame to get in */
    CBLioDelta = SampleCountLSW - i;
    if(CBLioDelta != 0xb0) {    /* if phase does not reset.. */
        LockStatus = 0;         /* try again to lock */
    }
    else {
        LockStatus = 3;         /* set to 3 so this single shots */
        GetAESTOD();            /* get AESin TODin again */
    }
}
else {
    LockStatus = FALSE;
    AES_SEL = 0x100;            /* lock lost, release phase reset bit */
}
LastPllADCData = ADCData;
}
```

FIG. 9 (CONT.)

FLEXIBLE PHASE-LOCKED LOOP SYSTEM TO INDICATE SYNCHRONIZATION USING DIFFERENCE BETWEEN INTERNAL AND EXTERNAL CLOCK SIGNALS

The present invention is a continuation-in-part application of U.S. patent application Ser. No. 08/992,641, filed Dec. 17, 1997 issued as U.S. Pat. No. 6,104,222, which is assigned to the assignee of the present invention.

BACKGROUND OF THE INVENTION

1. Field of the Invention

The present invention relates in general to phase locked loop circuits and more particularly, to a method and apparatus for providing a flexible phase locked loop system that is compatible with a variety of standards.

2. Description of the Related Art

In the filming industry, it is desirable to synchronize each film frame or video frame to the corresponding audio samples, so that the appropriate speech, music and/or sound effects may be matched with the corresponding action during playback.

To accomplish this, the frames are counted and provided to a master circuit which runs the projector and the audio systems at the same speed. As shown in FIG. 1A, the film is typically run at 24 frames per second. The audio signals are typically sampled at 48 kHz. For this example, each of the frames have 2,000 corresponding audio samples. The master circuit typically employs a phase locked loop (PLL) system 10 (FIG. 1B) comprising a phase-frequency detector (PFD) 12, a voltage-controlled oscillator (VCO) 14, a divide-by-A circuit 16 and a divide-by-B circuit 18. The frequency divider circuits 16 and 18 are used in the feedback loops of the PLL so that frequencies higher than that of the input clock signal can be generated. The output of the VCO 14 is provided as a first output signal for internal operations of the master circuit. The output of the VCO 14 is also provided to the divide-by-A circuit 16, which subsequently generates a second output signal that is typically used to synchronize the video information with audio information (which typically operates at 48 kHz). The value of A is determined by the ratio of the master clock frequency to the audio frequency to be synchronized to. For example, if the audio frequency is 48 kHz, and the master clock frequency is 12.288 MHz, A=256.

The second output signal is also provided to the divide-by-B circuit 18. The divide-by-B circuit 18 generates a feedback signal that is provided to the PFD 12. The value of B is determined by a ratio of the audio frequency to be synchronized to and the frame clock frequency. For example, if the audio frequency is 48 kHz and the frame clock frequency is 24 Hz, the value of B will be 2,000. The PFD 12 receives input signals from a frame clock and compares the phase/frequency of the input signals with the phase/frequency of the feedback signal. The PFD 12 produces a control voltage which is a function of the difference (error) between the input signal and the feedback signal. The PFD 12 presents the control voltage to a loop filter 14, which filters the output voltage of the PFD 12 and subsequently provides the filtered output voltage to the VCO 16 to adjust the frequency of the output signal. After some time as determined by the frequency response of the loop, the PLL system 10 locks onto the input clock signal and presents an output having a stable frequency and phase.

However, such an approach requires a substantially lengthy period for the PLL system 10 to lock onto the input clock signal, because the input clock signal operates at a low frequency, typically 24 Hz. In addition, the PLL system 10 is susceptible to noise conditions such as power supply fluctuations, etc. To avoid the slow response time and instability of such a PLL system, a higher input clock frequency is used. A typical frequency is the horizontal frequency as established by the National Television Systems Committee (NTSC). Although such an approach overcomes the slow response time and instability problems of the previous technique, it cannot provide the flexibility of accommodating a variety of video formats like the Phase Alternating Line (PAL), Sequential Couleur avec Memoire (SECAM) and NTSC.

Accordingly, there is a need in the technology for providing a stable PLL system that provides a fast response time, while providing flexibility and compatibility with a variety of video standards.

BRIEF SUMMARY OF THE INVENTION

A stable and flexible synchronization system and method are disclosed. The method comprises (a) selecting to receive one of a plurality of external clock signals; (b) detecting a difference between an internal clock signal and the selected one of a plurality of external clock signal and generating a first control signal representing the difference; (c) determining if the first control signal has a first value that is within a predetermined range; (d) if so, calculating a second value representing an absolute value of a difference between a current value of the first control signal and a previous value of the first control signal, otherwise repeating (c); (e) determining if the second value is less than a third value; (f) if so, resetting the output signal upon receipt of an edge of said selected one of the plurality of external clock signals, otherwise repeating (c); (g) determining if a timing difference between the output signal and the selected one of the plurality of external clock signals is substantially zero; (h) if so, issuing a signal indicative of synchronization, otherwise repeating (c).

BRIEF DESCRIPTION OF THE DRAWINGS

FIG. 3 is a chart illustrating a variety of frequency values that VCO 130 of FIG. 2 may be configured to provide, so as to enable the PLL system 100 to accommodate a corresponding variety of input signals.

FIGS. 4A and 4B are charts illustrating a variety of values P, D, N and M for the respective divide counters 110, 140, 156 and 160 of FIG. 2, corresponding to a variety of video formats.

FIG. 5 is a chart illustrating a variety of values of the divide counters P, D, N and M for the respective divide counters 110, 140,156 and 160 of FIG. 2, when the phase lock loop system 100 is configured to adjust the corresponding frequencies provided by a variety of systems.

FIG. 9 illustrates one embodiment of the software code used to implement the synchronization process of the invention.

DETAILED DESCRIPTION OF THE INVENTION

The present invention is an apparatus and method for providing a stable phase locked loop system that provides a fast response time, while providing compatibility with a variety of video standards.

Figure 1A:
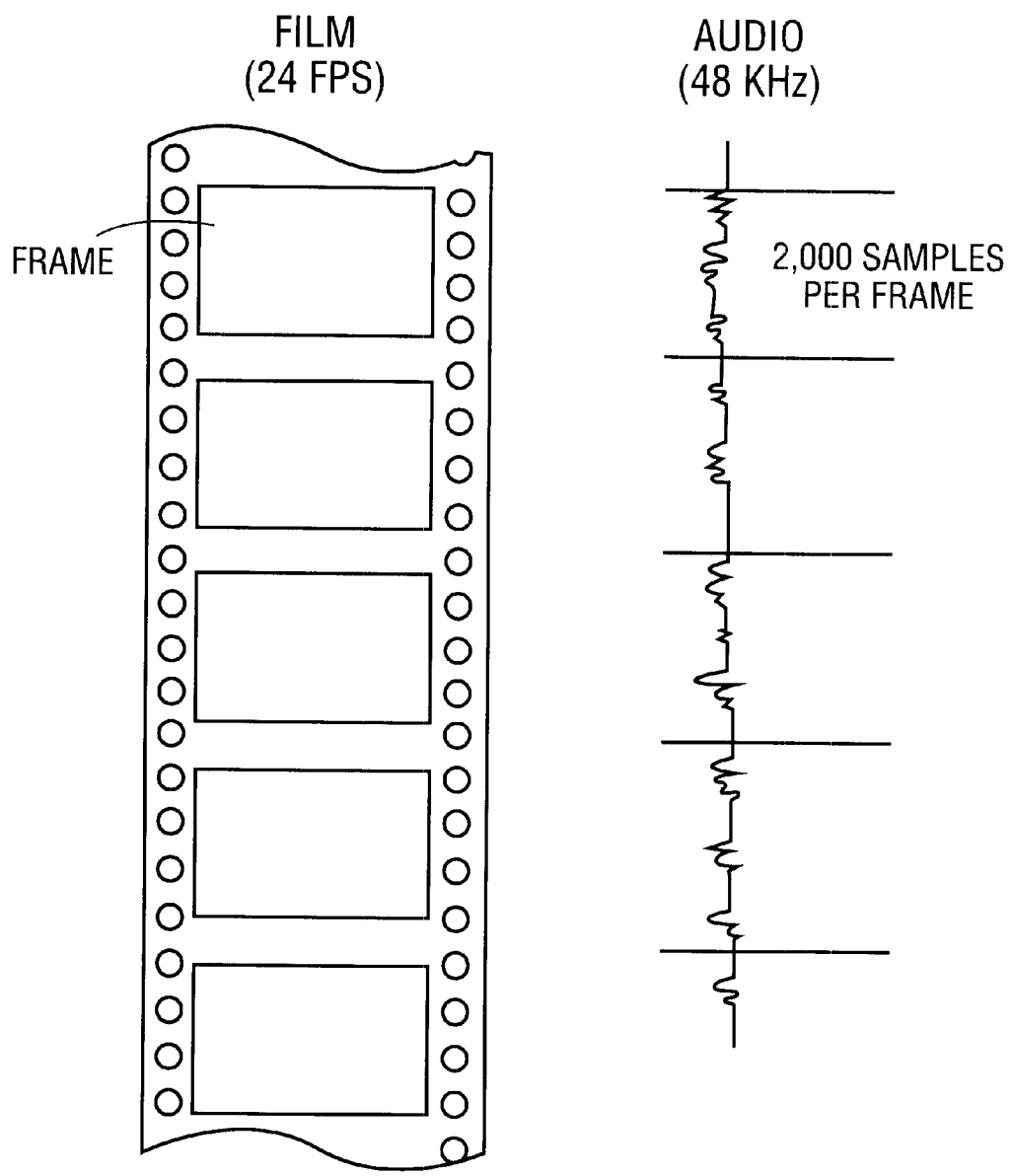
FIG. 1A illustrates a conventional technique for synchronizing video and audio information.
Figure 1B:
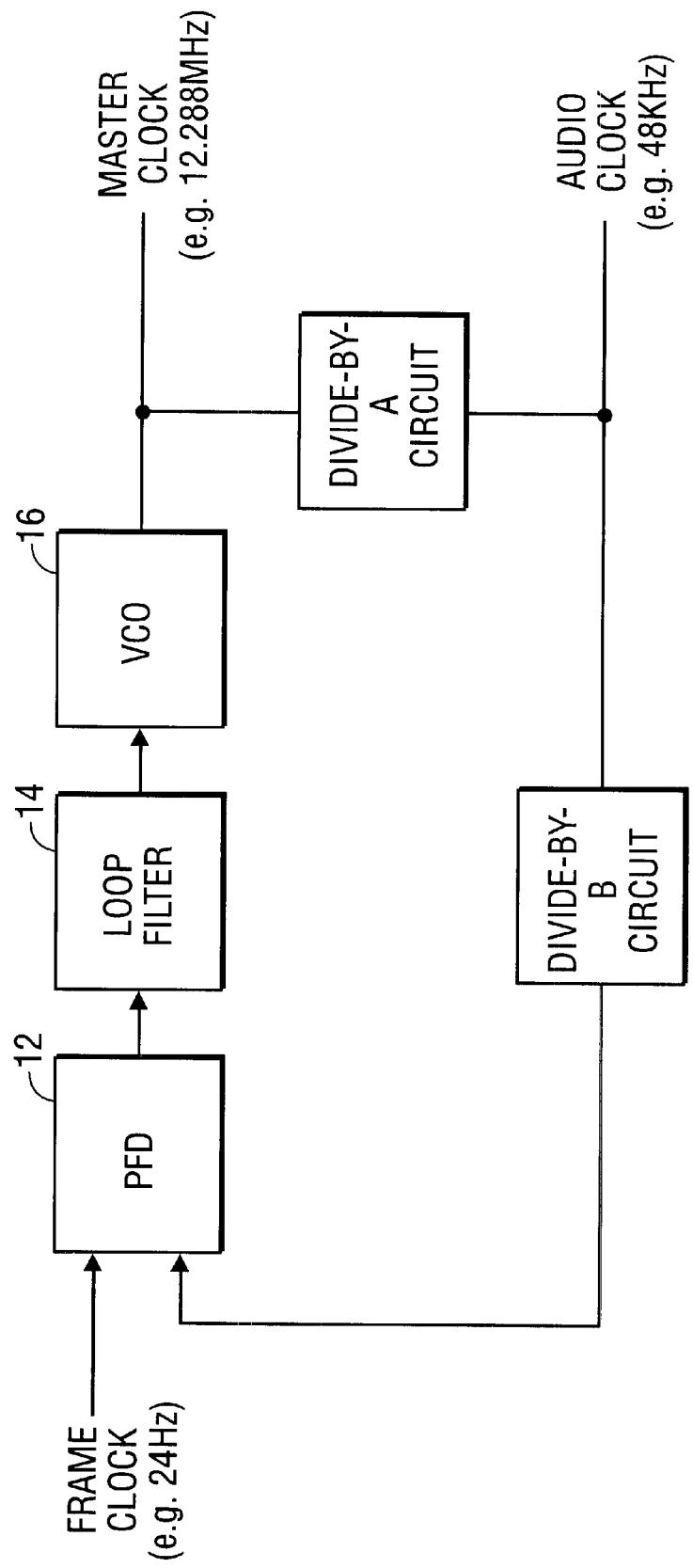
FIG. 1B illustrates a conventional phase locked loop circuit.
Figure 2:
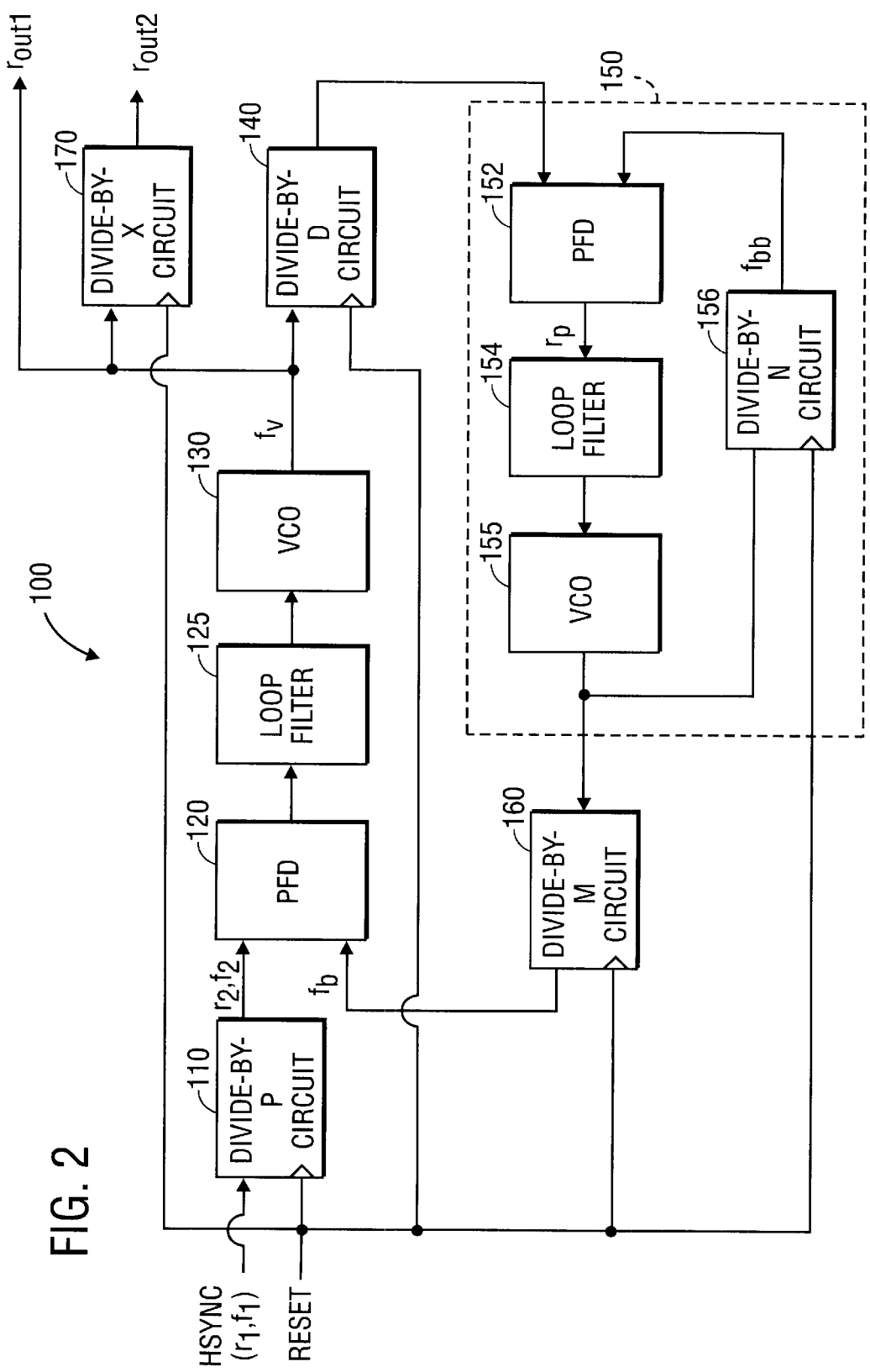
FIG. 2 illustrates one embodiment of the phase locked loop system 100 in accordance with the teachings of the present invention.

FIG. 2 illustrates one embodiment of the phase locked loop system 100 in accordance with the teachings of the present invention. In the following discussion, the phase locked loop (PLL) system 100 is described with reference to a horizontal synchronization (HSYNC) signal that is derived from a video signal. Although the PLL system 100 of the present invention may be particularly suited for synchronizing video information to audio information, it is apparent to one of ordinary skill in the technology that the PLL system 100 may be readily applied to any other system in which frequency or phase synchronization is required.

The phase locked loop (PLL) system 100 comprises a divide-by-P circuit 110, a phase frequency detector (PFD) 120, a loop filter 125, a voltage-controlled oscillator (VCO) 130, a divide-by-D circuit 140, a phase lock loop circuit 150 and a divide by M circuit 160. In one embodiment, the voltage-controlled oscillator 130 is a voltage-controlled crystal oscillator. In one embodiment, the PFD 120 and VCO 130 may be implemented using the High Performance Phase Frequency Locked Loop as marketed by Texas Instruments of Dallas, Tex., under the part designation TLC29321. In one embodiment, the loop filter 125 may be implemented using a low pass filter. Examples of such a low pass filter includes a lag filter, a lag-lead filter and an active filter. The PLL system 100 receives the HSYNC-signal $r_1$, and provides the HSYNC signal to a divide-by-P circuit 110 which divides the frequency $f_1$ of $r_1$ by an integer, P. This is accomplished so as to enable the user to configure the PLL system 100 to operate at any desired lower frequency. The resulting signal $r_2$ has a frequency $f_2=f_1/P$, which is provided as one input to phase frequency detector (PFD) 120.

The PFD 120 compares the input signal $r_2$ with a feedback signal $f_b$, and provides a control voltage to a loop filter 125. The loop filter 125 is provided to ensure stable loop operation and low jitter. The filtered control voltage is then provided to the VCO 130 which generates a frequency $f_v$. The output of the VCO 130 is provided as a first output clock signal $r_{OUT1}$, which is used to drive the internal operations of the master circuit (not shown) which implements the PLL system 100. It is apparent to one of ordinary skill in the technology that the first output clock signal $r_{OUT1}$ may be used to drive any desired circuit. The output of the VCO 130 is also provided to a divide-by-X circuit 170, which subsequently generates a second output clock signal $r_{OUT2}$ that is used to drive a second circuit (not shown). For example, $r_{OUT2}$ may be used as a master clock to analog-to-digital (A/D) or digital-to-analog (D/A) converters operating at the audio sample rate. It is apparent to one of ordinary skill in the technology that the PLL system 100 may be used to synchronize $r_1$ with $r_{OUT1}$ and/or $r_{OUT2}$. In one embodiment, the value of X is determined by a ratio of the master clock frequency for the audio converters to the audio sample frequency. For example, if the audio information operates at 48 kHz and the master clock frequency (i.e., $r_{OUT1}$) is 12.288 MHz etc., then the value of X is 256.

The first output signal $r_{OUT1}$ is also provided to the divide-by-D circuit 140, which divides the frequency of $r_{OUT1}$ by an integer D. The divide-by-D circuit 140 is implemented to facilitate use of a phase locked loop (PLL) circuit 150 that operates at a desired frequency. The resulting signal, $r_3$ (which has a frequency of $f_3$) is provided to the PLL circuit 150, which in turn generates a signal $r_4$ having a frequency of $f_4$. The value of D is determined by a ratio of the frequency of $r_{OUT1}$, i.e., $f_{OUT1}$, to the quantity $(M*f_1/N)$. The PLL circuit 150 is used to assist in locking the signal $r_4$ to the frequency of the signal $r_3$, i.e., to $f_3$. In one embodiment, the PLL circuit 150 comprises a PFD 152, a loop filter 154, a VCO 155 and a divide-by-N circuit 156. In one embodiment, the PFD 152 and VCO 155 may be implemented using the High Performance Phase-Frequency Locked Loop as marketed by Texas Instruments of Dallas, Tex., under the part designation TLC29321. In one embodiment, the loop filter 154 may be implemented using a low pass filter. Examples of such a low pass filter includes a lag filter, a lag-lead filter and an active filter.

The PFD 152 receives $r_3$ and compares the phase/frequency of $r_3$ (i.e., $f_3$) with the phase/frequency of a feedback signal $f_{bb}$. The PFD 152 produces a control voltage which is a function of the difference (error) between the input signal $r_3$ and the feedback signal. This difference is a frequency difference between the input signal $r_3$ and the feedback signal $f_{bb}$, when the PLL circuit 150 has not yet locked onto the input signal $r_3$. Upon locking onto the input signal $r_3$, the PFD 152 detects the phase difference between the input signal $r_3$ and the feedback signal fbb. The PFD 152 presents the control voltage to loop filter 154, which filters the control voltage and subsequently provides the filtered control voltage to the VCO 155 to adjust the frequency of its output signal $r_p$. The output of VCO 155 is provided as a feedback signal to the divide-by-N circuit 156, which divides the frequency of the output of VCO 155 by N. The resulting signal is provided as a feedback signal fbb to PFD 152. After some response time, as determined by the frequency response of the loop filter 154, the PLL circuit 150 locks onto the signal $r_3$ and presents an output signal $r_4$.

The signal $r_4$ is next provided to a divide-by-M circuit 160, which subsequently divides the $f_4$ by an integer M. The value of M is determined by $f_4/f_1$. The divide-by-M circuit 160 generates a feedback signal $f_b$ that is provided to the PFD 120. As discussed earlier, the PFD 120 receives HSYNC signals from a frame clock and compares the phase/frequency of the input signals with the phase/frequency of the feedback signal $f_b$. The PFD 120 produces a control voltage which is a function of the difference (error) between the input signal (i.e., HSYNC or $r_1$) and the feedback signal $f_b$. This difference is a frequency difference between the input signal (HSYNC or $r_1$) and the feedback signal $f_b$, when the PLL circuit 100 has not yet locked onto the input signal (HSYNC or $r_1$). Upon locking onto the input signal (HSYNC or $r_1$), the PFD 120 detects the phase difference between the input signal (HSYNC or $r_1$) and the feedback signal $f_b$. The PFD 120 presents a control voltage to the VCO 130 to adjust the frequency of the output signal. After some time as determined by the frequency response of the loop filter 125, the PLL system 100 locks onto the input clock signal $r_1$ and presents output signals $r_{OUT1}$ and $r_{OUT2}$, each having a stable frequency and phase.

The relationship between the values P, D, N and M of the respective divider circuits 110, 140, 156 and 160, with that of the input signal, HSYNC (or $r_1$ having a frequency of $f_1$) and the frequency $f_v$ generated by the VCO 130 may be expressed as follows:

$$f_1 P = [f_v * N]/[D * M]$$

Using numerical techniques, the smallest value of P, N, D and M may be obtained. It is apparent to one of ordinary skill in the technology that divider circuit(s) providing any other multiple of the smallest value of P, N, D and M may be implemented, according to need and availability.

A further aspect of the present invention is the use of a reset signal RESET (see FIG. 2) for synchronizing the reset of all the divider circuits 110, 140, 156, 160 and 170. As is apparent to one of ordinary skill in the art, any combination of the divider circuits 110, 140, 156, 160 and 170 may be synchronously or simultaneously reset using the reset signal. In this manner, all or a combination of the divider circuits 110, 140, 156, 160 and 170 may be reset with a single input, and timing considerations associated with individual reset of the divider circuits 110, 140, 156, 160 and 170 may be dispensed with. In one embodiment, the reset signal is applied coincident with the frame edge of the incoming video source so that the audio sample clock edge is exactly coincident with the video frame edge.

FIG. 3 is a chart illustrating a variety of frequency values that the crystal oscillator of FIG. 2 may be configured to provide, so as to accommodate a corresponding variety of frame rates. As shown, for a sample rate of 48 kHz, the VCO 130 provides a frequency ($f_v$) of 12288000 Hz.

FIGS. 4A and 4B are charts illustrating a variety of values P, D, N and M for the respective divide counters 110, 140, 156 and 160 of FIG. 2, corresponding to a variety of video formats, based on a sample rate of 48 kHz (i.e., where $r_{OUT2}$ is 48 kHz) and where $f_v$, the frequency generated by the VCO 130 is 12.288 MHz. As shown in FIG. 4A, when interfacing with an NTSC Color format, the input signal $r_1$ has a frequency $f_1$ of 15.73426573 kHz. The corresponding value of P for divide-by-P circuit 110 is 15, so as to provide a signal $r_2$ of frequency 1.048951049 kHz. The corresponding value of D in the divide-by-D circuit 140 is 32, and the output frequency $f_3$ of the divide-by-D circuit 140 is 384.000 kHz. The corresponding value of N in the divide-by-N circuit 156 is 50, while the frequency of the VCO 155 is 19.2 MHz. The corresponding value of M in the divide-by-M circuit 160 is 18304, while the output frequency of the divide-by-M circuit 160 is 1.048951049 kHz.

When interfacing with an NTSC Black and White format, the input signal $r_1$ has a frequency $f_1$ of 15.750 kHz. The corresponding value of P for divide-by-P circuit 110 is 10, so as to provide a signal $r_2$ of frequency 1.575 kHz. The corresponding value of D in the divide-by-D circuit 140 is 32, and the output frequency $f_3$ of the divide-by-D circuit 140 is 384.000 kHz. The corresponding value of N in the divide-by-N circuit 156 is 42, while the frequency of the VCO 155 is 16.128 MHz. The corresponding value of M in the divide-by-M circuit 160 is 10240, while the output frequency of the divide-by-M circuit 160 is 1.575 kHz.

When interfacing with the PAL format, the input signal $r_1$ has a frequency $f_1$ of 15.625 kHz. The corresponding value of P for divide-by-P circuit 110 is 10, so as to provide a signal $r_2$ of frequency 1.5625 kHz. The corresponding value of D in the divide-by-D circuit 140 is 32, and the output frequency $f_3$ of the divide-by-D circuit 140 is 384.000 kHz. The corresponding value of N in the divide-by-N circuit 156 is 50, while the frequency of the VCO 155 is 19.2 MHz. The corresponding value of M in the divide-by-M circuit 160 is 12288, while the output frequency of the divide-by-M circuit 160 is 1.5625 kHz.

FIG. 5 is a chart illustrating a variety of values P, D, N and M for the respective divide counters 110, 140, 156 and 160 of FIG. 2, when the phase lock loop system 100 is configured to adjust the corresponding frequencies provided by a variety of systems. As shown, the "off" speeds differ from the sample rate of 48 kHz or 44.1 kHz by ±0.1%. In the case of the sample rate of 48 kHz, the "off" speeds include an "up" speed of 48.048 kHz (difference of ±0.1% from 48 kHz), and a "down" speed of 47.95205 kHz (difference of −0.1% from 48 kHz). In such a case, the various values, such as P, D, N, $f_v$ and M must be reconfigured.

For example, when interfacing with the NTSC format, and used for adjusting from a sample rate of 48 kHz to an "up" speed of 48.048 kHz, the input-signal $r_1$ has a frequency $f_1$ of 15.73426573 kHz. The corresponding value of P for divide-by-P circuit 110 is 15, so as to provide a signal $r_2$ of frequency 1.048951049 kHz. The corresponding value of D in the divide-by-D circuit 140 is 32, and the output frequency $f_3$ of the divide-by-D circuit 140 is 384 kHz. The corresponding value of N in the divide-by-N-circuit 156 is 50, while the frequency of the VCO 155 is 19.2MHz. The corresponding value of M in the divide-by-M circuit 160 is 18304, while the output frequency of the divide-by-M circuit 160 is 1.048951049 kHz. Other examples are illustrated in FIG. 5.

The present invention thus provides a stable and flexible PLL system-that provides a fast response time, while providing compatibility with a variety of video standards.

Figure 6A:
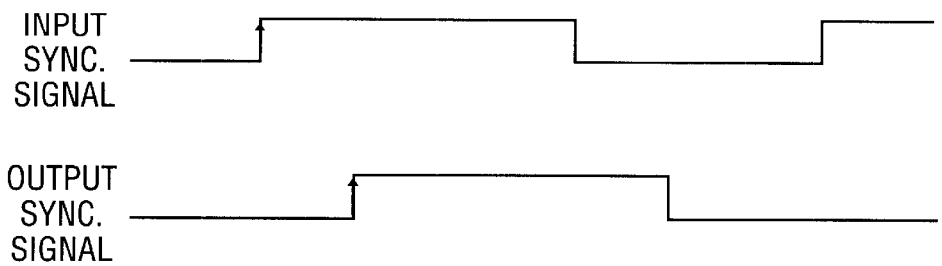
FIG. 6A illustrates one example of unsynchronized input and output sync signals.
Figure 6B:
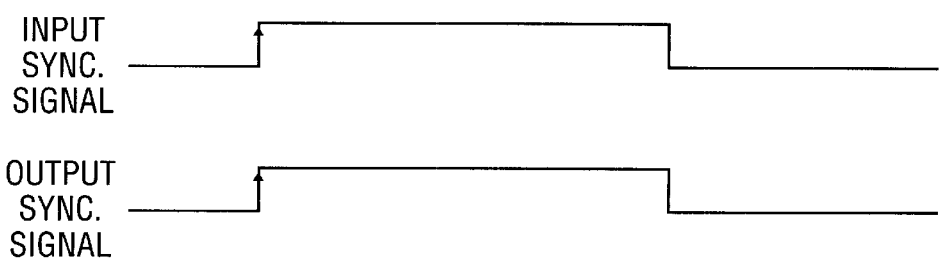
FIG. 6B illustrates one example of synchronized input and output sync signals.
Figure 6C:
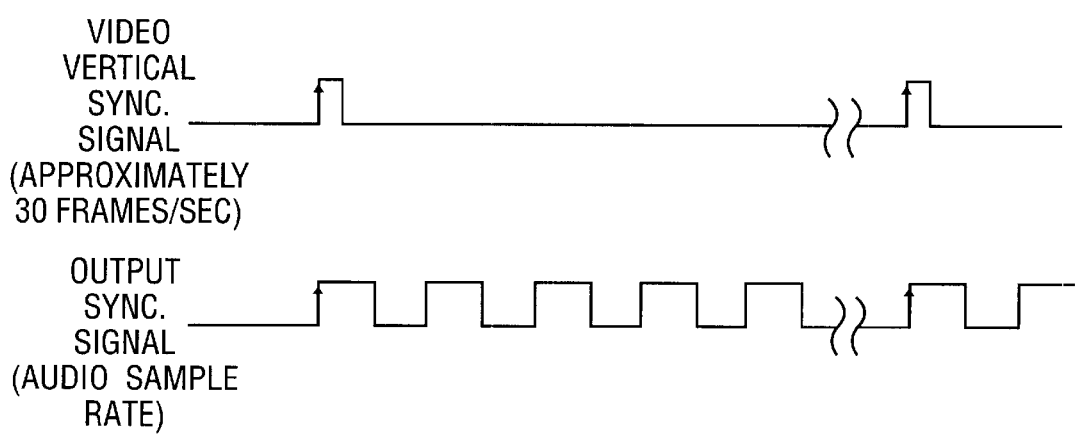
FIG. 6C illustrates one example of synchronized input and output sync signals in which a video vertical sync signal is used as the sync source.

In typical audio and video systems, the time difference between the incoming synchronization ("sync") signal and the outgoing audio signal (which is based on the output sync signal) is generally random, as shown in FIG. 6A, and thus unsynchronized, resulting in the loss of sound quality due to phase differences between different audio sources. Attempts at synchronization to provide input and output sync signals as shown in FIG. 6B are achieved with equal input and output audio sampling rates. FIG. 6C illustrates one example in which the video vertical sync signal (or frame sync) is used as the sync source. In this case, the video sync signal rising edge is coincident with a rising edge of the output sync signal every video frame.

Figure 7B:
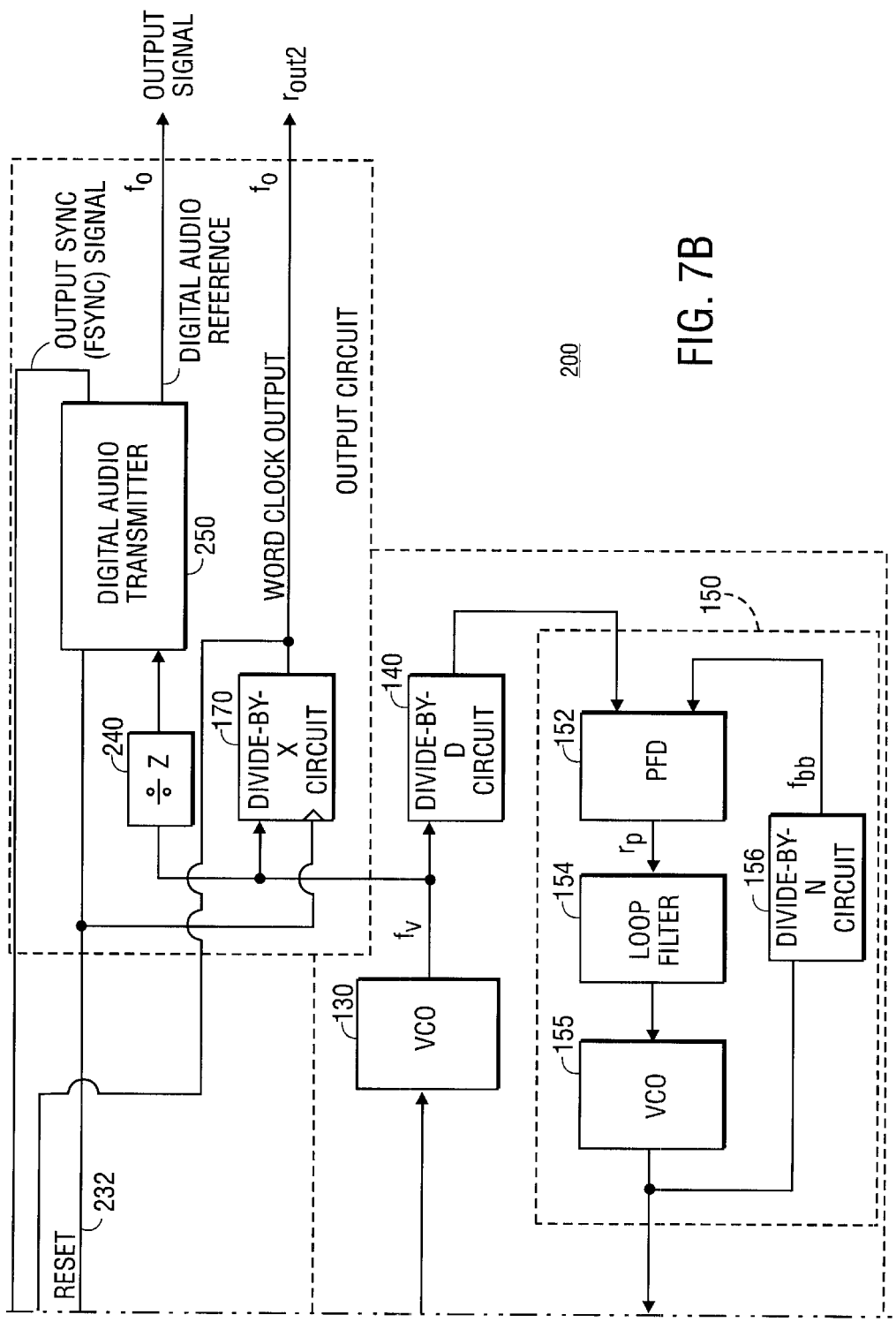
FIG. 7 illustrates one embodiment of the synchronization system 200 provided in accordance with the teachings of the present invention.

FIG. 7 illustrates one embodiment of the synchronization system 200 provided in accordance with the teachings of the present invention. As shown, the synchronization system 200 comprises the divide-by-P circuit 110, a phase lock loop PLL 115, a divide-by-X circuit 170, an analog-to-digital converter 220, a processor 230 such as a digital signal processor (DSP), a divide-by-Z circuit 240 and a digital audio transmitter 250. In one embodiment, the processor 230 includes any one of the x86, Pentium™, Pentium II™, and Pentium Pro™ microprocessors as marketed by Intel™ Corporation, the K-6 microprocessor as marketed by AMD™, or the 6x86MX microprocessor as marketed by Cyrix™ Corp. Further examples include the Alpha processor as marketed by Digital Equipment Corporation™, the 680X0 processor as marketed by Motorola™; or the Power PC processor as marketed by IBM™. In addition, any of a variety of other processors, including those from Sun, MIPS, IBM, Motorola, NEC, Cyrix, AMD, Nexgen and others may be used for implementing processor 230. The processor 230 is not limited to microprocessor but may take other forms such as a microcontroller, digital signal processor, reduced instruction set computer, application specific integrated circuit, and the like. Although shown with one processor, synchronization system 200 may alternatively include multiple processing units.

The PLL 115 comprises a PFD 120, loop filter 125, VCO 130, divide-by-D circuit 140, the phase lock loop circuit 150, the divide-by-M circuit. The PFD 120, loop filter 125, VCO 130, divide-by-D circuit 140, the phase lock loop circuit 150, the divide-by-M circuit 160 and the divide-by-X circuit 170 are the same as that shown in FIG. 2. However, in the synchronization system 200, the divide-by-D circuit 140, the divide-by-N circuit 156, the divide-by-M circuit 160 and the divide-by-X circuit 170 are not reset through the RESET signal of FIG. 2, but by a Reset signal 232 that is issued by a processor 230, as discussed in detail in the following sections. The synchronization system 200 further comprises a sync multiplexer (MUX) 210 that receives inputs from a variety of sources. Such sources include, but are not limited to, a Word Clock circuit (not shown) that provides a Word Clock signal, a digital audio receiver 212, that provides a digital audio frame sync signal, and a video sync circuit, that provides a horizontal sync (HSYNC) signal to the sync mux 210 and a vertical sync (VSYNC) signal to the processor 230. One example of the digital audio receiver 212 is the Audio Engineering Society/European Broadcaster's Union ("AES/EBU") receiver, such as that marketed by Cirrus Logic, Inc., under the part designation CS8412 or CS8414.

The processor 230 also receives the digital audio frame signal from the digital audio receiver 212, and the VSYNC signal generated by the video sync circuit 214. The processor 230 further receives digital signals from an analog-to-digital converter (ADC) 220, which generates digital values that are proportional to the analog output of the PFD 120. In one embodiment, the ADC 220 is an 8-bit converter, which provides digital values in the range of 0 to 255. The processor 230 generates a Select signal that is provided to the sync mux 210 to select one of the plurality of input signals received by the sync mux 210. The processor 230 further generates a RESET signal 232 that is provided to the divide-by-X circuit 170 and a digital audio transmitter 250. One example of the digital audio transmitter 250 is the AES/EBU transmitter, such as that marketed by Cirrus Logic Inc., under the part designation 8402A or 8404A.

As shown in FIG. 7, the output $f_v$ of the VCO 130 is provided to the divide-by D circuit 140, the divide-by-X circuit 170 and a divide-by-Z circuit 240. The output of the divide-by-Z circuit 240 is provided to the digital audio transmitter 250, which generates an output sync (Fsync) signal and a digital audio reference output signal based on the output $f_v$ of the VCO 130. The output sync signal Fsync is fed back to the processor 230, which issues the reset signal 232 based on one of the input sync signals, in accordance with the principles of the invention, which is discussed in detail in the following sections. The digital audio reference output signal (AES reference signal) may be used as a reference signal to provide digital audio synchronization between digital audio devices. The output $r_{OUT2}$ of the divide-by-X circuit 170 is fed back to the processor 230 as an output sync signal at the audio rate. This square wave signal is often referred to as a "word clock." In particular, the output signal $r_{OUT2}$ is provided as an output of the synchronization system 200 to connect to the input of a second synchronization system 200 (or other digital audio device) where the sync mux of that second system selects a word clock signal. In addition, the output digital audio reference is provided as the output of the synchronization system 200 to connect to the input of a second system 200 where the sync mux of the second system 200 selects the frame signal from the digital audio receiver 212 which receives the AES reference signal. In this manner, the system 200 may provide synchronization between two digital audio systems. In addition, the input signal of the system 200 may be selected from a variety of input sources, including but not limited to a word clock circuit, an AES reference signal source or a video source.

In accordance with the practices of persons skilled in the art of computer programming, the present invention is described below with reference to symbolic representations of operations that are performed by synchronization system 200, unless indicated otherwise. Such operations are sometimes referred to as being computer-executed. It will be appreciated that the operations which are symbolically represented include the manipulation by processor 230 of electrical signals representing data bits and the maintenance of data bits at memory locations in memory (not shown), as well as other processing of signals. The memory locations where data bits are maintained are physical locations that have particular electrical, magnetic, optical, or organic properties corresponding to the data bits.

When implemented in software, the elements of the present invention are essentially the code segments to perform the necessary tasks. The program or code segments can be stored in a processor readable medium or transmitted by a computer data signal embodied in a carrier wave over a transmission medium or communication link. The "processor readable medium" may include any medium that can store or transfer information. Examples of the processor readable medium include an electronic circuit, a semiconductor memory device, a ROM, a flash memory, an erasable ROM (EROM), a floppy diskette, a CD-ROM, an optical disk, a hard disk, a fiber optic medium, a radio frequency (RF) link, etc. The computer data signal may include any signal that can propagate over a transmission medium such as electronic network channels, optical fibers, air, electromagnetic, RF links, etc. The code segments may be downloaded via computer networks such as the Internet, Intranet, etc.

Figure 8:
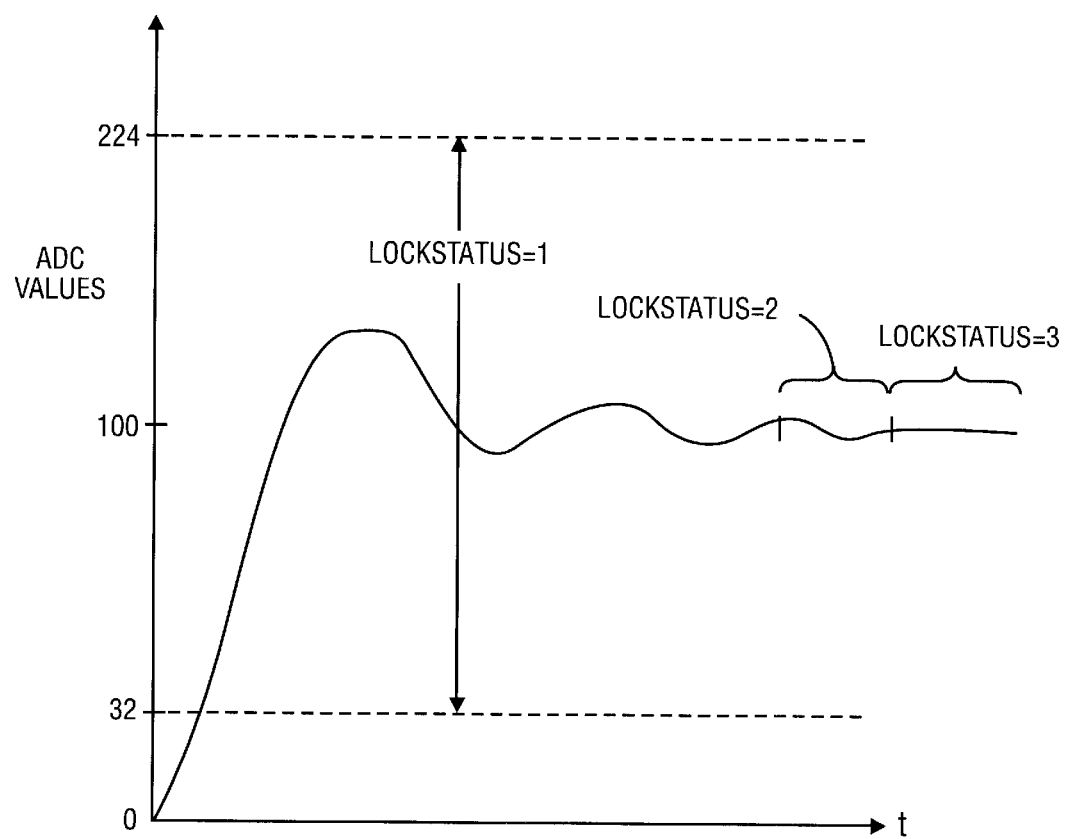
FIG. 8 is a graph illustrating the difference between the input and output sync signals.

FIG. 8 is a graph illustrating the ADC 220 output level, which represents the voltage at the input of VCO 130. Any timing difference between the input and output sync signals $f_i$ and $f_o$ will cause the phase lock loop to lose lock. For present discussion purposes, reference to a timing difference refers to the timing difference in the leading or trailing edges of the input and output sync signals $f_i$ and $f_o$. When the timing difference is zero, the leading or trailing edges (depending on the edge selected as a reference) are coincident, i.e., the signals are synchronized, as shown in FIG. 6B. As shown in FIG. 7, upon receiving an input signal $f_i$, the synchronization system 200 generates an output sync signal $f_o$. The output sync signal $f_o$ may be that generated by the digital audio transmitter 250 (i.e., Fsync) or the divide-by X-circuit 170 (i.e., $r_{OUT2}$), depending on the corresponding input signal. In particular, if the input signal is a word clock signal, then the output sync signal is $r_{OUT2}$; if the input signal is a digital audio frame sync signal, then the output sync signal is Fsync. In either case, the timing difference between the output sync signal $f_o$ and the input sync signal $f_i$ is initially large and rapidly changing. The processor 230 is configured to monitor the VCO 130 input and issue a signal indicating that the two signals are synchronized when the timing difference is substantially zero.

Figure 10A:
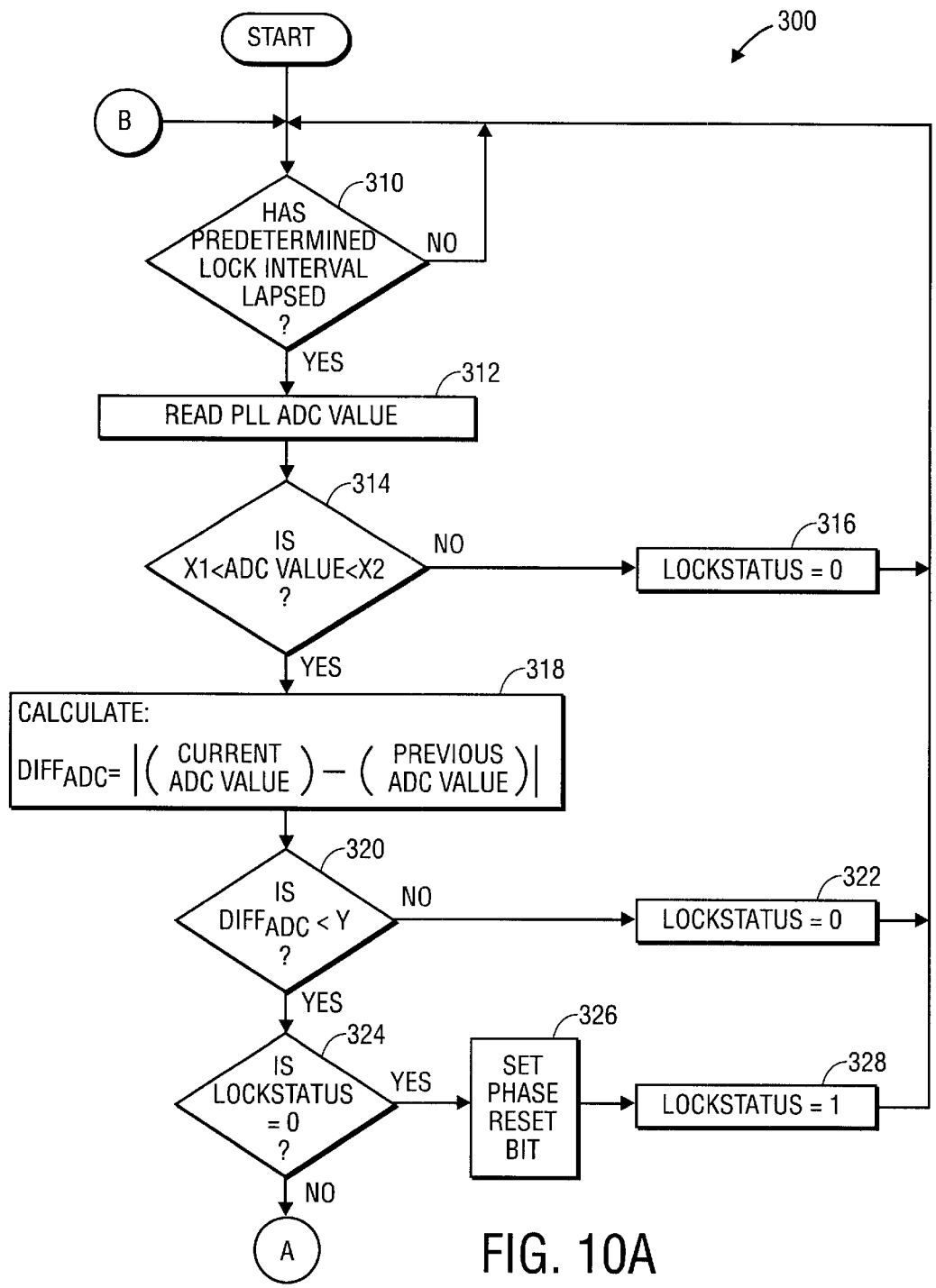
FIGS. 10A and 10B are flow charts illustrating one embodiment of the synchronization process of the invention.
Figure 10B:
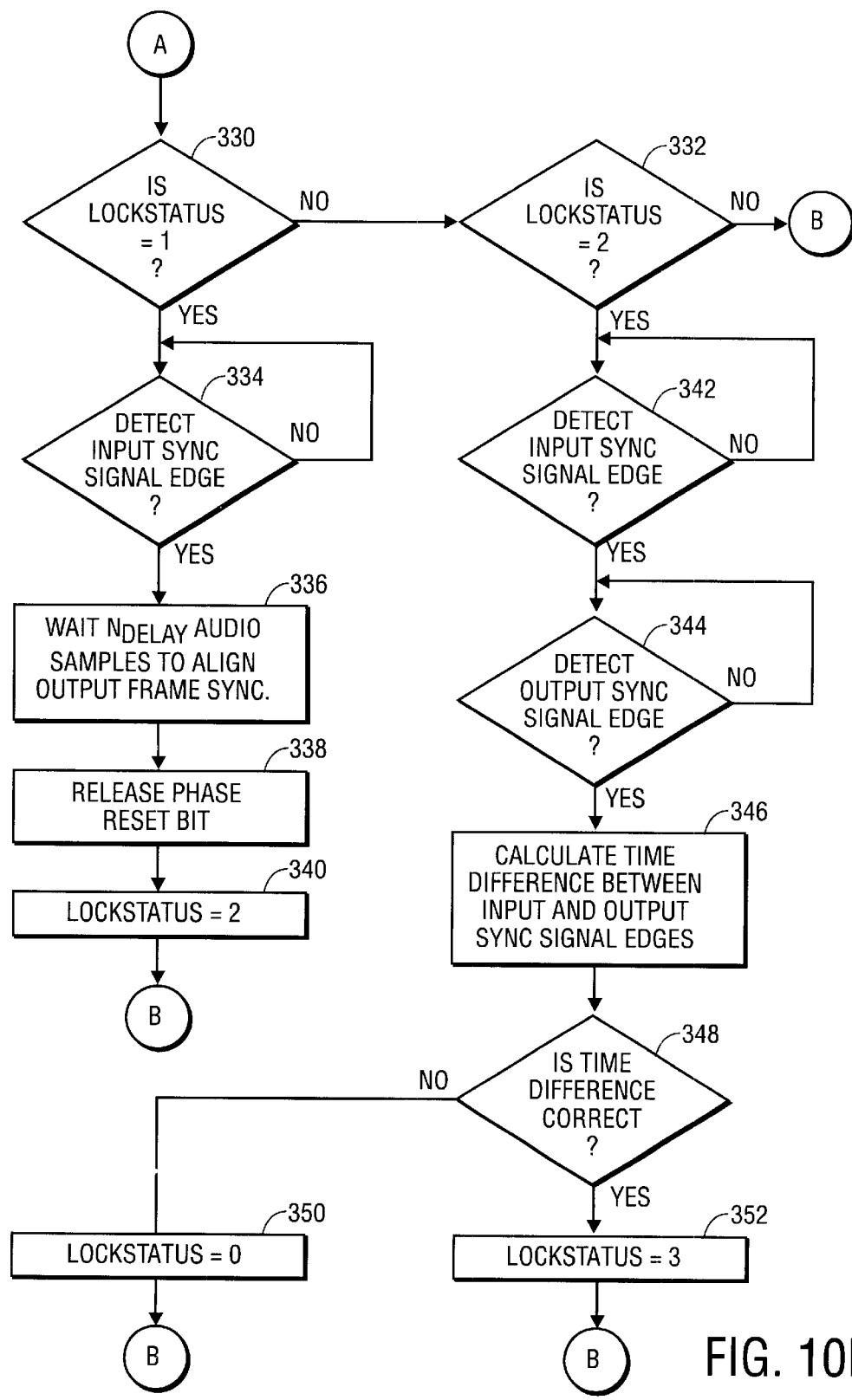

In one embodiment, such a process is provided in software that is executed by the processor 230. A C language version of this software embodiment is shown in FIG. 9 and a flow chart of the software is shown in FIGS. 10A and 10B.

The software may be stored in memory (not shown) coupled to the DSP 230. The synchronization is monitored in three stages. The first, referred to as LOCKSTATUS=1 is established when the output [hereinafter referred to as "ADC value"] of the ADC 220, which represents the output-of the Loop Filter 125, is X1<ADC value<X2, where X1 and X2 are predetermined integers. In one embodiment, where the ADC 220 is an 8-bit converter, X1 is 24 and X2 is 232. When LOCKSTATUS=1, it indicates that the ADC value is within a range that is acceptable for further synchronization monitoring. Next, the DSP 230 determines if the ADC value difference is less than Y, where Y is a predetermined integer. In this case, the ADC value difference $DIFF_{ADC}$ is calculated as follows:

$$DIFF_{ADC}=|(\text{current ADC value})-(\text{previous ADC value})| \quad \text{equation (1)}.$$

In one embodiment, Y is in a range between 3 and 20. In a second embodiment, Y is 5. When the relationship $DIFF_{ADC}<Y$ is established, LOCKSTATUS=2. The next stage, LOCKSTATUS=3, is achieved when the timing difference between $f_i$ and $f_o$ is substantially equal to zero after the phase reset circuit is activated (see discussion below). When this occurs, the processor 230 will indicate that the required synchronization is accomplished.

FIGS. 10A and 10B are flow charts illustrating one embodiment of the synchronization process of the invention. Beginning from a start state, the process 300 proceeds to decision block 310, where it determines if a predetermined time interval has elapsed. This interval is selected for running the process 300 at a predetermined time, for example, every second. If so, the process 300 reads the PLL 115's ADC 220 value, as shown in process block 312. The process 300 then determines if the ADC value is between X1 and X2, i.e., if X1<ADC value<X2, where X1 and X2 are predetermined integers. As discussed earlier, if the ADC 220 is an 8-bit converter, having values in the range of 0 and 255, then X1 may be selected to be 24 and X2 may be selected to be 232. If the ADC value is not within this range, then LOCKSTATUS is set to zero, as shown in process block 316 and the process 300 returns to decision block 310. Otherwise, the process 300 proceeds to process block 318. At process block 318, the process 300 calculates the difference $DIFF_{ADC}$, between the current ADC value and the previous ADC value, in accordance with equation (1). The process 300 then advances to decision block 320 and determines if $DIFF_{ADC}$ is less than a predetermined value Y, where Y is an integer. In one embodiment, Y is in a range between 3 and 20 depending on the frequency variation in the incoming clock signal. In a second embodiment, Y is fixed at 7. If $DIFF_{ADC}>Y$, then the LOCKSTATUS is set to 0 (process block 322) and the process 300 returns to process block 310. When the relationship $DIFF_{ADC}<Y$ is established, the process 300 proceeds to decision block 324 to determine if LOCKSTATUS=0, if so, the Phase Reset Bit is set to TRUE (process block 326) and LOCKSTATUS is set to 1 (process block 328). When the Phase Reset Bit is set, it indicates to the reset circuit that the required phase lock or synchronization has not yet been achieved. Later when the phase reset bit is released, the RESET signal will be pulsed near the: time of the next edge of the input sync source. Next, the process 300 returns to process block 310.

If, at decision block 324, the LOCKSTATUS≠0, the process 300 advances to decision block 330, where it queries if LOCKSTATUS is equal to 1. If not, the process 300 advances to decision block 332, where it checks if LOCK-STATUS is equal to 2. If not, it proceeds back to process block 310. If LOCKSTATUS=1, it proceeds to decision block 334, where it determines if the input sync signal edge has been detected. If not, the process 300 remains at block 334, where it continues to monitor for the input sync signal edge. Otherwise, it proceeds to process block 336, where the processor 230 waits $N_{DELAY}$ (typically 42 in one embodiment) audio samples and then issues the RESET signal by releasing the phase reset bit in process block 338. The process 300 then proceeds to block 340, where it sets LOCKSTATUS=2 and returns to process block 310.

If, at decision block 332 LOCKSTATUS=2, the process 300 waits until both the input and output sync edges have been detected (done by process blocks 342 and 344). The process 300 then proceeds to process block 346, where it checks the time difference between the leading or trailing edges of the input and output sync signals. The process 300 then determines if the time difference is substantially equal to zero, as shown in decision block 348. If not, the process 300 sets LOCKSTATUS to 0 (process block 350) and returns to decision block 310. Otherwise, it proceeds to process block 352, where it sets LOCKSTATUS=3, indicating that the required synchronization is achieved. The process 300 then continues to monitor the LOCKSTATUS by proceeding to decision block 310.

The present invention thus provides an apparatus and method for providing synchronization between two signals, one of which may be selected from a plurality of sources, including a video source, an audio source and a word clock circuit. For example, the synchronization system may synchronize an audio signal with another audio signal, an audio signal with a video signal and/or a word clock signal to another word clock signal. Such synchronization may be accomplished with increased precision and flexibility over that provided by existing systems.

The present invention may be embodied in other specific forms without departing from its spirit or essential characteristics. The described embodiments are to be considered in all respects only as illustrative and not restrictive. The scope of the invention is, therefore, indicated by the appended claims rather than the foregoing description. All changes which come within the meaning and range of equivalency of the claims are to be embraced within their scope.

What is claimed is:

1. A synchronization system, comprising:
   a circuit for receiving one of a plurality of external clock signals;
   a first phase frequency detector coupled to the circuit for detecting a difference between an internal clock signal and the received one of the plurality external clock signal, said first phase frequency detector generating a first, control signal representing the difference;
   a first voltage controlled oscillator coupled to said first phase frequency detector, for generating a first timing signal based on said first control signal;
   a second phase frequency detector for detecting a difference between the first timing signal and a second timing signal, said second phase frequency detector generating a second control signal representing the difference;
   a second voltage controlled oscillator coupled to said second phase frequency detector, for generating a third timing signal based on said second control signal;
   a first divider circuit coupled to said second voltage controlled oscillator, for dividing said third timing signal by a first predetermined number to provide the second timing signal;
   a second divider circuit coupled to said second voltage controlled oscillator, for dividing said third timing signal by a second predetermined number to provide said internal clock signal;

a processing circuit coupled to said first phase frequency detector, for generating a third control signal based on the first control signal, the processing circuit also generates a select signal for selecting one of the plurality of external clock signals;

an output circuit coupled to the processing circuit and the first voltage controlled oscillator, the output circuit providing an output signal based on the third control signal and the first timing signal.

2. The system of claim 1, wherein the output circuit also provides the output signal to the processing circuit.

3. The system of claim 2, wherein the output circuit comprises:

a third divider circuit that is coupled to the first voltage controlled oscillator and the processing circuit, for dividing said first timing signal by a third predetermined number to provide a first output signal;

a fourth divider circuit that is coupled to the first voltage controlled oscillator and the processing circuit, for dividing said first timing signal by a fourth predetermined number to provide a second output signal;

wherein the processing circuit selects one of the first or the second output signals as the output signal in response to the selected one of a plurality of external clock signals.

4. The system of claim 1, further comprising an analog-to-digital converter coupled between said first phase frequency detector and said processing circuit.

5. The system of claim 1, wherein said one of the plurality of external clock signals selected from a group consisting of a word clock signal, a digital audio frame synchronization signal and a horizontal synchronization signal.

6. The system of claim 1, further comprising a third divider circuit having an output coupled to an input of said first phase-detector, said third divider circuit being coupled to receive said external clock signal, said third divider circuit dividing said external clock signal by a third predetermined number.

7. The system of claim 6, further comprising a fourth divider circuit having an input coupled to an output of said first voltage controlled oscillator, said fourth divider having an output coupled to an input of said second phase detector, said fourth divider, dividing said first timing circuit by a fourth predetermined number.

8. The system of claim 3, wherein said third predetermined number is a ratio of a frequency of said external clock signal to a frequency of said output signal.

9. The system of claim 1, wherein said first predetermined number is a value of a frequency of said external clock signal multiplied by said second predetermined number, divided by a frequency of said first voltage controlled oscillator.

10. The system of claim 9, wherein said fourth predetermined number is a ratio of a first value to a second value, where said first value is a frequency of the first voltage controlled oscillator multiplied by said first predetermined number, and said second value is a frequency of the external clock signal multiplied by said second predetermined number.

11. The system of claim 1, further comprising a reset line coupled from said processing circuit to said output circuit, said reset line being coupled to receive a reset signal for resetting said output circuit.

12. The system of claim 11, where reset signal is applied synchronously with respect to an edge of one of said plurality of external clock signals.

13. A method for synchronizing one of a plurality of external clock signals to a timing signal, comprising:

(a) selecting to receive one of a plurality of external clock signals;

(b) detecting a difference between an internal clock signal and the selected one of a plurality of external clock signal and generating a first control signal representing the difference;

(c) generating a first timing signal based on said first control signal;

(d) dividing said first timing signal by a first predetermined number to provide an output signal;

(e) detecting a difference between the first timing signal and a second timing signal and generating a second control signal representing the difference;

(f) generating a third timing signal based on said second control signal;

(g) dividing said third timing signal by a second predetermined number to provide the second timing signal;

(h) dividing the third timing signal by a third predetermined number to provide said internal clock signal.

14. The method of claim 13, further comprising:

(i) determining if the first control signal has a first value that is within a predetermined range;

(j) if so, calculating a second value representing an absolute value of a difference between a current value of the first control signal and a previous value of the: first control signal, otherwise repeating (i);

(k) determining if the value is less than a third value; and (l) if so, resetting the output signal upon receipt of an edge of said selected one of the plurality of external clock signals, otherwise repeating (i).

15. The method of claim 14, further comprising:

(m) determining if a timing difference between the output signal and the selected one of the plurality of external clock signals is substantially zero;

(n) if so, issuing a signal indicative of synchronization, otherwise repeating (i) and issuing a signal indicative of incorrect synchronization.

16. The method of claim 14, further comprising repeating (i)–(l) after a predetermined amount of time has lapsed.

17. The method of claim 15, further comprising repeating (i)–(n) after a predetermined amount of time has lapsed.

18. The method of claim 13, wherein in detecting a difference between an internal clock signal and the one of a plurality of external clock signals, the difference is one of: a phase and a frequency difference.

19. The method of claim 13, wherein in detecting a difference between an internal clock signal and the one of a plurality of external clock signals, the difference is one of: a phase and a frequency difference.

20. The method of claim 13, wherein in dividing said first timing signal, said first predetermined number is a ratio of a frequency of said external clock signal to a frequency of said output signal.

21. The method of claim 13, wherein in dividing said third timing signal, said second predetermined number is a value of a frequency of said external clock signal multiplied by said third predetermined number, divided by a frequency of said first voltage controlled oscillator.

22. A system for synchronizing signals in a processor-based system, comprising:

a memory for storing instruction sequences by which the processor-based system is processed, a processor coupled to the memory for processing the instruction sequences, wherein the instruction sequences cause the processor to (a) select to receive one of a plurality of external clock signals; (b) detect a difference between an internal clock signal and the selected one of a plurality of external clock signal and generating a first control signal representing the difference; (c) determine if the first control signal has a first value that is within a predetermined range; (d) if so, calculating a second value representing an absolute value of a difference between a current value of the first control signal and a previous value of the first control signal, otherwise repeating (c); (e) determining if the second value is less than a third value; (f) if so, resetting the output signal upon receipt of an edge of said selected one of the plurality of external clock signals, otherwise repeating (c); (g) determining if a timing difference between the output signal and the selected one of the plurality of external clock signals is substantially zero; (h) if so, issuing a signal indicative of synchronization, otherwise repeating (c).

23. The system of claim 22, further comprising repeating (c)–(g) after a predetermined amount of time has lapsed.

24. The system of claim 22, wherein in detecting a difference between an internal clock signal and the one of a plurality of external clock signals, the difference is one of: a phase and a frequency difference.

25. The system of: claim 22, wherein in detecting a difference between an internal clock signal and the one of a plurality of external clock signals, the difference is one of: a phase and a frequency difference.

26. A computer program product, comprising:

a computer usable medium having computer program code embodied therein for accessing at least one readable storage in a processor-based system, the computer program product having:

(a) computer readable program code for (a) selecting to receive one of a plurality of external clock signals;

(b) computer readable program code for detecting a difference between an internal clock signal and the selected one of a plurality of external clock signal and generating a first control signal representing the difference;

(c) computer readable program code for (c.1) determining if the first control signal has a first value that is within a predetermined range, (c.2) if so, calculating a second value representing an absolute value of a difference between a current value of the first control signal and a previous value of the first control signal, otherwise repeating (c.1);

(d) computer readable program code for (d.1) determining if the value is less than a third value; (d.2) if so, resetting the output signal upon receipt of an edge of said selected one of the plurality of external clock signals, otherwise repeating (c.1);

(e) computer readable program code for (e.1) determining if a timing difference between the output signal and the selected one of the plurality of external clock signals is substantially zero, (e.2) if so, issuing a signal indicative of synchronization, otherwise repeating (c.1).

27. The computer readable program product of claim 26, further comprising computer readable program code for repeating (c.1), (c.2), (d.1), (d.2), (e.1) and (e.2) after a predetermined amount of time has lapsed.

* * * * *